United States Patent [19]

Merrick et al.

[11] Patent Number: 5,049,527
[45] Date of Patent: Sep. 17, 1991

[54] OPTICAL ISOLATOR

[75] Inventors: Stephen P. Merrick, Sunnyvale; Robert W. Teichner, Palo Alto, both of Calif.

[73] Assignee: Hewlett-Packard Company, Palo Alto, Calif.

[21] Appl. No.: 365,148

[22] Filed: Jun. 9, 1989

Related U.S. Application Data

[62] Division of Ser. No. 76,094, Jul. 21, 1987, Pat. No. 4,863,806, which is a division of Ser. No. 748,520, Jun. 25, 1985, Pat. No. 4,694,183.

[51] Int. Cl.⁵ .......................................... H01L 21/60
[52] U.S. Cl. ..................................... 437/220; 437/906; 361/421; 174/52.4; 29/827
[58] Field of Search ............. 437/209, 906, 220; 357/19; 250/551; 361/421

[56] References Cited

U.S. PATENT DOCUMENTS

| | | | |
|---|---|---|---|
| 3,660,669 | 5/1972 | Grenon | 250/239 |
| 3,839,782 | 10/1974 | Lincoln | 357/70 |
| 3,893,158 | 7/1975 | Lincoln | 357/19 |
| 3,925,801 | 12/1975 | Hartz et al. | 357/19 |
| 4,047,045 | 9/1977 | Paxton | 250/551 |
| 4,156,148 | 5/1979 | Kaufman | 250/551 |
| 4,322,628 | 3/1982 | Tanaka | 250/551 |
| 4,633,582 | 1/1987 | Ching et al. | 250/551 |

FOREIGN PATENT DOCUMENTS

| | | |
|---|---|---|
| 2304148 | 8/1974 | Fed. Rep. of Germany . |
| 2176103 | 10/1973 | France . |
| 53-133384 | 11/1978 | Japan . |
| 54-012688 | 1/1979 | Japan . |
| 54-104787 | 8/1979 | Japan . |
| 57-197880 | 12/1982 | Japan . |
| 59-113672 | 6/1984 | Japan . |
| 60-16111 | 4/1985 | Japan . |
| 2107929 | 5/1983 | United Kingdom . |

Primary Examiner—Olik Chaudhuri
Assistant Examiner—Andrew Griffis

[57] ABSTRACT

An optical isolator is fabricated upon a lead frame having an LED section which is rotated 180° to position the LED over the photodiode. Prior to rotation both the LED and the photodiode attachment portions (81,83) of the leads are down set a predetermined amount to fix the size of the isolation gap between the LED and the photodiode. Dielectric sheets are attached to the outer surfaces of the LED and photodiode leads and an optically transmissive resin is injected therebetween to form a light guide and to encapsulate the LED and photodiode dice and their associated bond wires. In an alternate embodiment a sheet is attached to the outer surface of one lead and a dielectric sheet thereagainst is positioned at a tilted angle between the LED and the photodiode.

26 Claims, 13 Drawing Sheets

OPTICAL ISOLATOR

This is a division of application Ser. No. 076,094, now U.S. Pat. No. 4,863,806 filed on July 21, 1987, which was a division of application Ser. No. 748,520, filed June 25, 1985 and now issued as U.S. Pat. No. 4,694,183.

BACKGROUND AND SUMMARY OF THE INVENTION

An optical isolator may be used in an electrical circuit to allow signal propagation in a forward direction while maintaining voltage and current isolation between the input and the output of the optical isolator. Such an isolator includes a light emitting diode (LED) at the input, a photodiode at the output and an optically transmissive high breakdown voltage isolation gap separating the LED and the photodiode. In order to achieve optimum isolator performance the size of the isolation gap and the alignment of the LED and the photodiode must be maintained accurately during manufacture.

One prior art attempt to automate optical isolator manufacture, described in U.S. Pat. No. 4,446,375 and shown in FIGS. 1A-C hereof, has been to align the LED and the photodiode during fabrication by folding the LED lead and the separate LED bond lead into place over the detector in two ninety degree steps. Although the use of such a folded lead frame technique decreases the assembly time for each isolator a complex folding apparatus is required to make the two 90° folds which lie along different axes and errors in the placement of the folds may affect the accuracy of the LED-photodiode alignment. During folding, damage to the bond wires may occur because the LED lead and the LED bond lead are not securely attached together and because the dielectric sheet between the LED and the photodiode dice is free to rest against and damage the LED and photodiode bond wires. As additionally described in U.S. Pat. No. 3,925,801 and shown in FIG. 2 hereof, the size of the isolation gap in many prior art optical isolators is determined by the thickness of a dielectric sheet located between the LED and the photodiode. The insertion of such a sheet during manufacture has often resulted in bond wire damage.

In accordance with the illustrated preferred embodiment of the present invention, an optical isolator is manufactured simply and repeatably using standard form lead frames. Prior to die attachment and wire bonding of the optical isolator, the LED and photodiode attachment portions of the lead frame are displaced to a cotton plane located below the plane of the remainder of the lead frame. The entire LED section of the lead frame is then rotated 180 degrees about a pair of hinge pins until it is coplanar with the photodiode section of the lead frame. After rotation is completed the hinge pins are stamped to eliminate spring back of the rotated LED section of the lead frame. A clear resin is injected between two dielectric sheets attached to the outer surfaces of the LED and photodiode leads to form a light guide between the LED and the photodiode. The optical isolator is encapsulated and the protruding leads are cut and bent to the desired final package shape. In an alternate preferred embodiment of the present invention, a first dielectric sheet is attached to the outer surface of either the LED or the photodiode lead and a second dielectric sheet is positioned between the LED and the photodiode dice. The second sheet rests upon (and adheres to adhesive on) the first sheet and extends between the dice at an angle so that damage to the dice and to the bond wires is avoided.

DETAILED DESCRIPTION OF THE PREFERRED EMBODIMENT

Figure 1A:
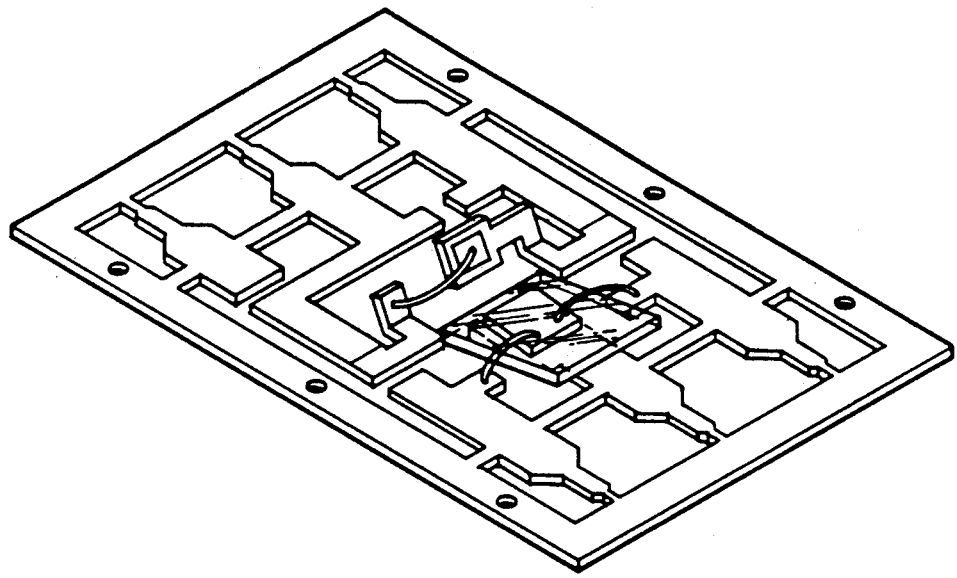
FIGS. 1A-C show a prior art optocoupler having a folded lead frame construction.
Figure 1B:
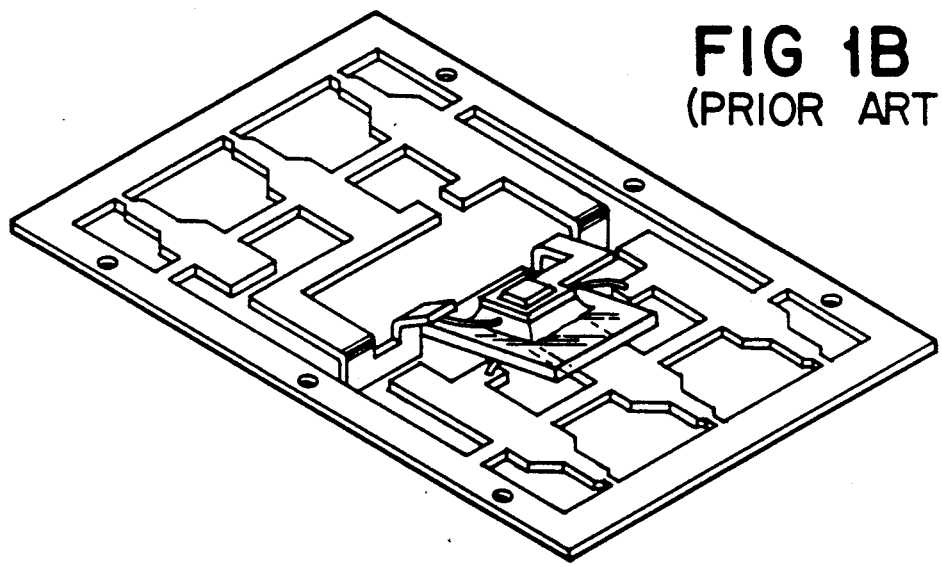
Figure 1C:
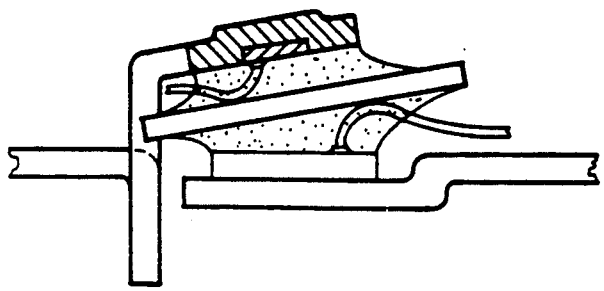
Figure 2:
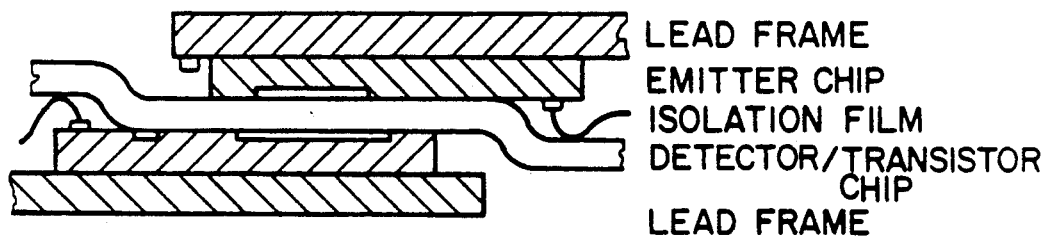
FIG. 2 shows a prior art optocoupler having a dielectric sheet compressed between the LED and the photodiode.

FIGS. 1 and 2 show optocouplers which are fabricated according to the prior art. FIGS. 1A-C illustrate two 90° folding steps, described in U.S. Pat. No. 4,446,375, which have been used in the manufacturer of prior art optocouplers to align the LED and the photodiode. FIG. 2 shows an optocoupler, described in U.S. Pat. No. 3,925,801, which uses the thickness of a single dielectric sheet compressed between the LED and the photodiode dice to establish the size of the isolation gap.

Figure 3:
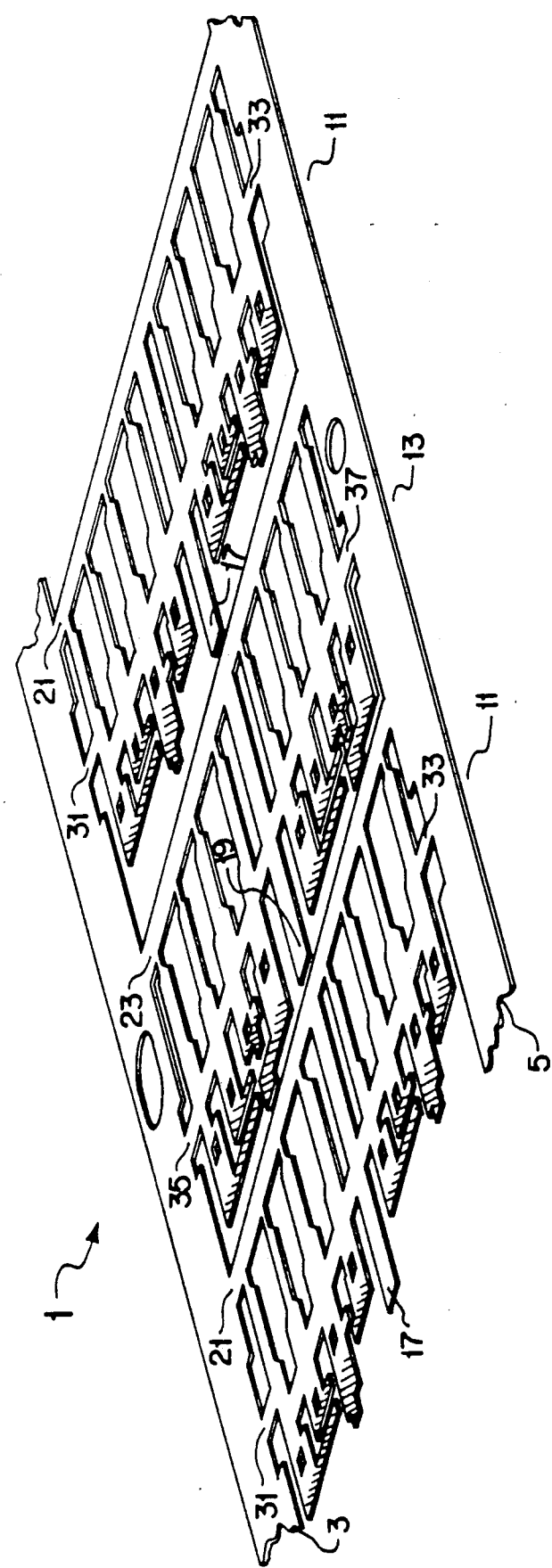
FIG. 3 shows an optical isolator lead frame in accordance with the preferred embodiment of the present invention.

FIG. 3 shows a lead frame 1 which is used in the assembly of an optical isolator in accordance with the preferred embodiment of the present invention. The lead frame 1 if 0.010 inch thick and is fabricated from alloy 42 (42% nickel, 58% iron) in a well known manner. The hatched regions are plated with gold to facilitate later die attach and wire bond operations and for the sake of clarity these plated regions are not shown in the Figures. Two side rails 3 and 5 provide longitudinal stability for the lead frame 1 which is approximately 8.4 inches in length and one inch in width. Repeated tie rails 21 and 23 provide lateral stability to the lead frame 1.

Ten each alternating LED sections 11 and photodiode sections 13 are located on lead frame 1 and each individual section is divided about arms 17 and seats 19 into identical left and right halves. The LED sections 11 are attached to side rails 3 and 5 by 0.014 inch wide hinge pins 31, 33 and the photodiode sections 13 are attached to side rails 3 and by dam bar ends 35, 37. During fabrication each left pair of LED sections 11 and photodiode sections 13 will be combined to form one optical isolator. Each right pair will be combined into one optical isolator in a like manner. A total of twenty optical isolators in standard integrated circuit 8-lead packages will be fabricated upon the single lead frame 1.

Figure 4B:
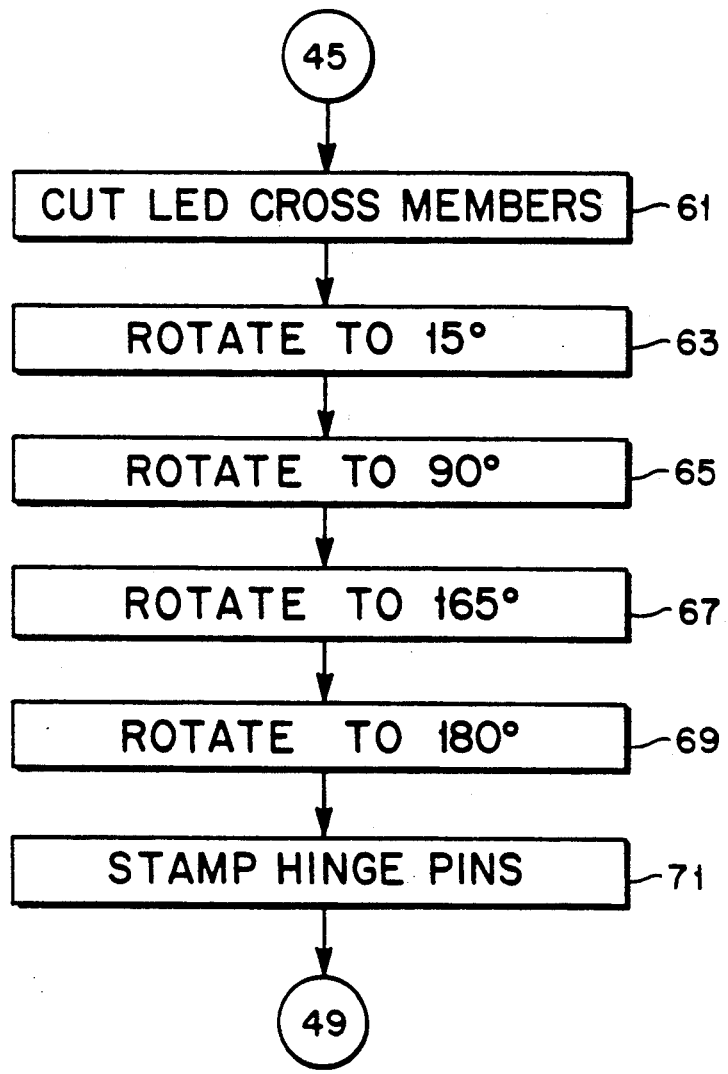
FIGS. 4A-B are a flow chart of the optical isolator assembly steps in accordance with the preferred embodiment of the present invention.
Figure 4A:
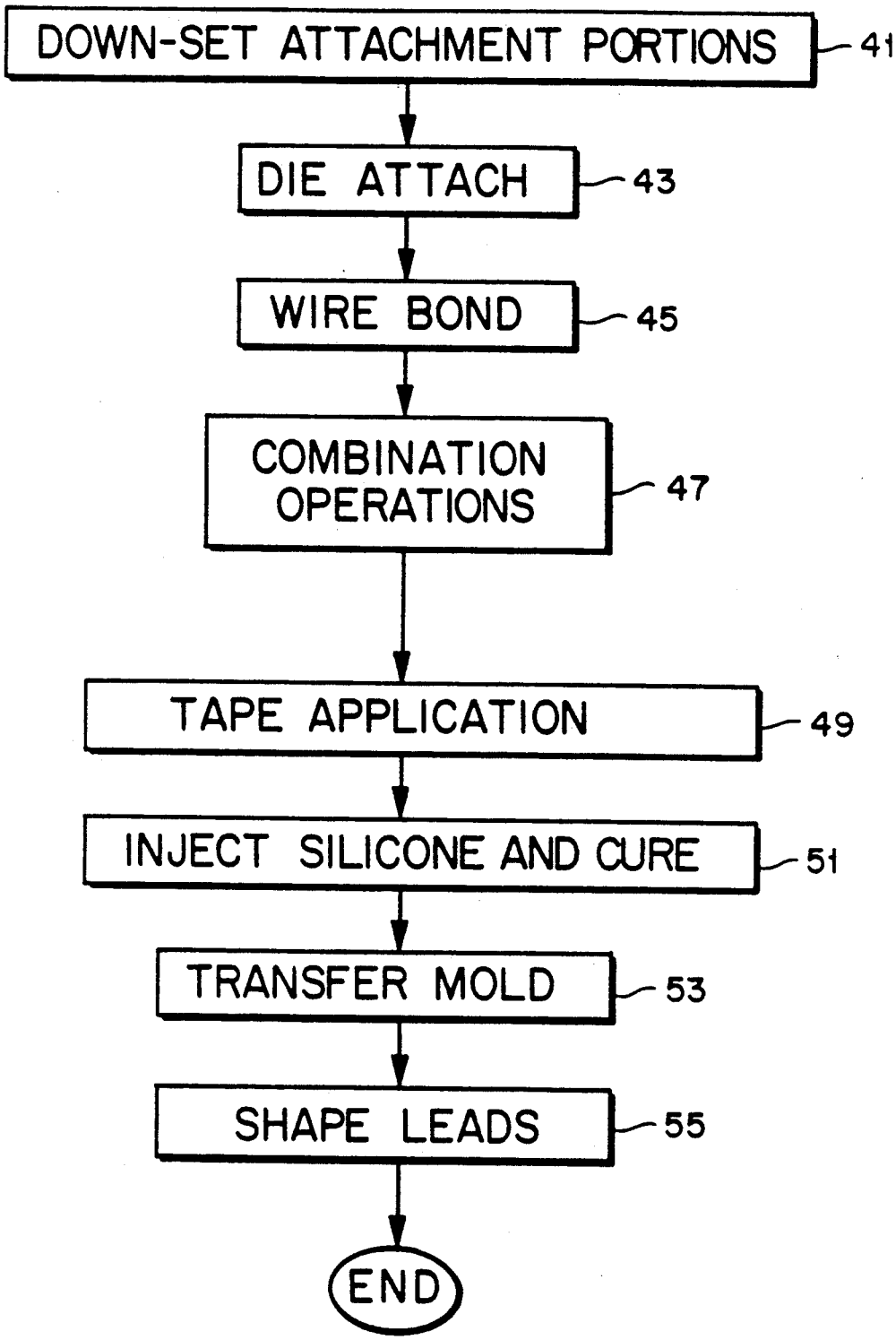

FIGS. 4A-B are a flow chart of the various assembly steps which are performed during the manufacture of an optical isolator in accordance with the present invention. The individual assembly steps for a single optical isolator 103 are discussed below in connection with FIGS. 5-11. During automated assembly all of the optical isolators on the lead frame 1 would be fabricated sequentially.

Figure 5:
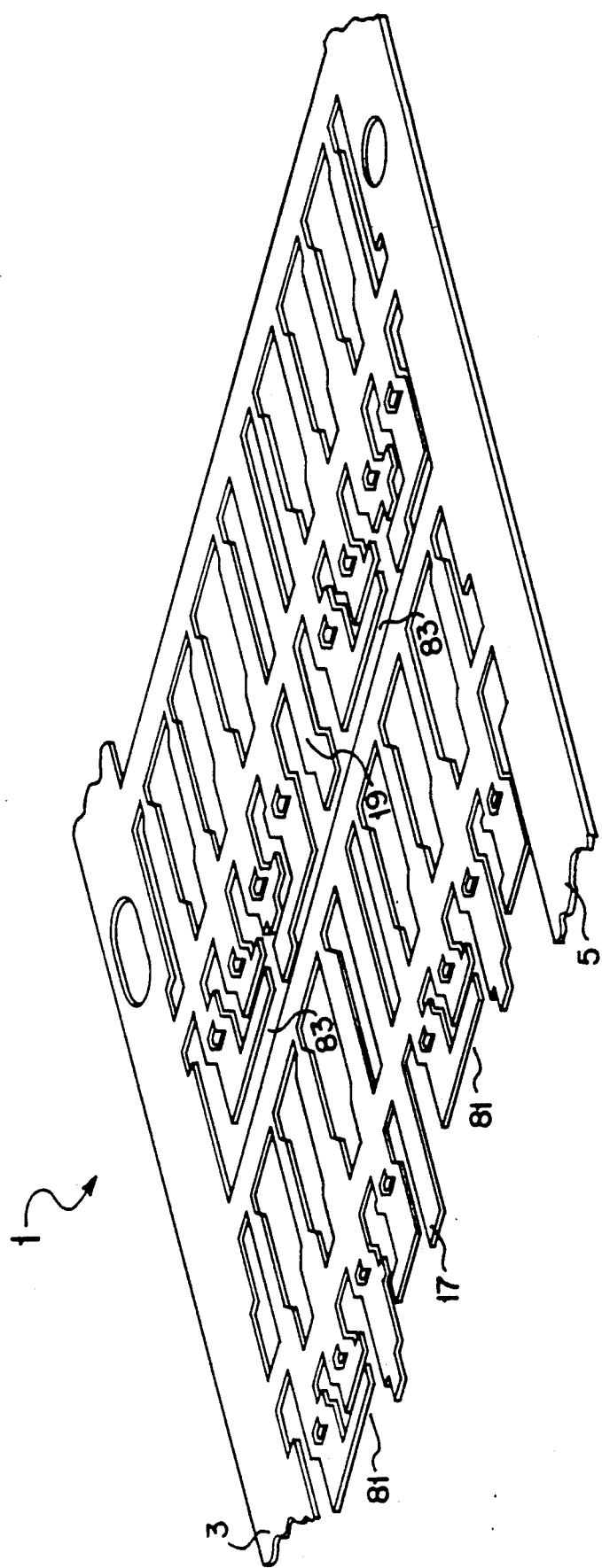
FIGS. 5-11 show various stages iu the assembly of the optical isolator in accordance with the flow chart of FIG. 4.

FIG. 5 shows the lead frame 1 after performance of step 41 in which attachment portions 81 and 83 are down set below the plane of side rails 3 and 5. The down set operation may easily be performed using well known stamping techniques and the amount of down set is predetermined to set the size of the isolation gap. For an isolation gap of 0.010 inch in the preferred embodiment, each of the attachment portions 81, 83 was down set a distance of 0.019 inch although this downset distance may vary with the thickness of different LED and photodiode dice. The seat 19 is down set by an amount equal to the thickness of the arm 17, i.e., 0.010 inch, to set coplanar alignment of the LED section 11 with the photodiode section 13 after rotation by allowing the arm 17 to rest against the down set area of the seat 19. After rotation is completed, the two sections 81 and 83 will be located equidistantly above and below the plane of the side rails 3, 5.

Figure 6:
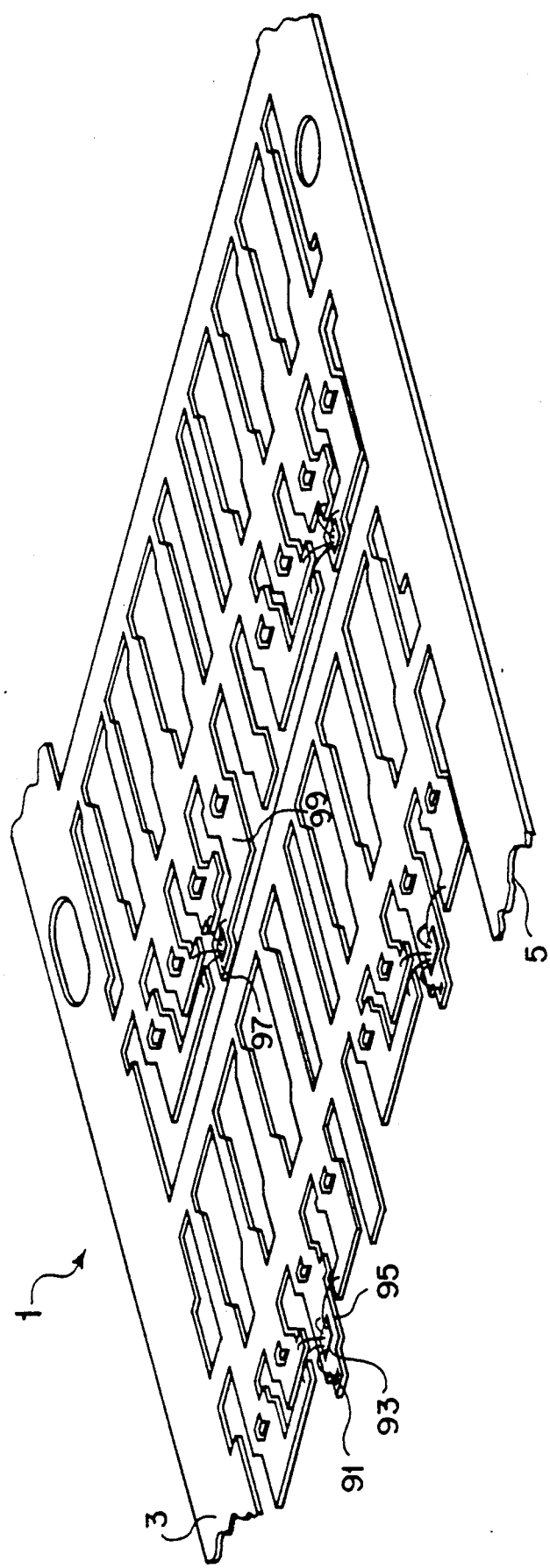

FIG. 6 shows steps 43 and 45 in which the die attach and wire bond operations are performed upon lead frame 1 in a conventional manner. An LED die 91 and an optional buffer die 93 are attached to an LED lead 95 and a photodiode die 97 is attached to a photodiode lead 99. Various bond wires are attached to the other leads shown as required The LED 91 is a high speed gallium arsenide phosphide device of the type described in U.S Pat. No. 3,836,793 which is incorporated herein by reference. The LED 91 has a thickness of approximately 0.006 inch and the photodiode 97 has a thickness of approximately 0.012 inch.

Figure 7:
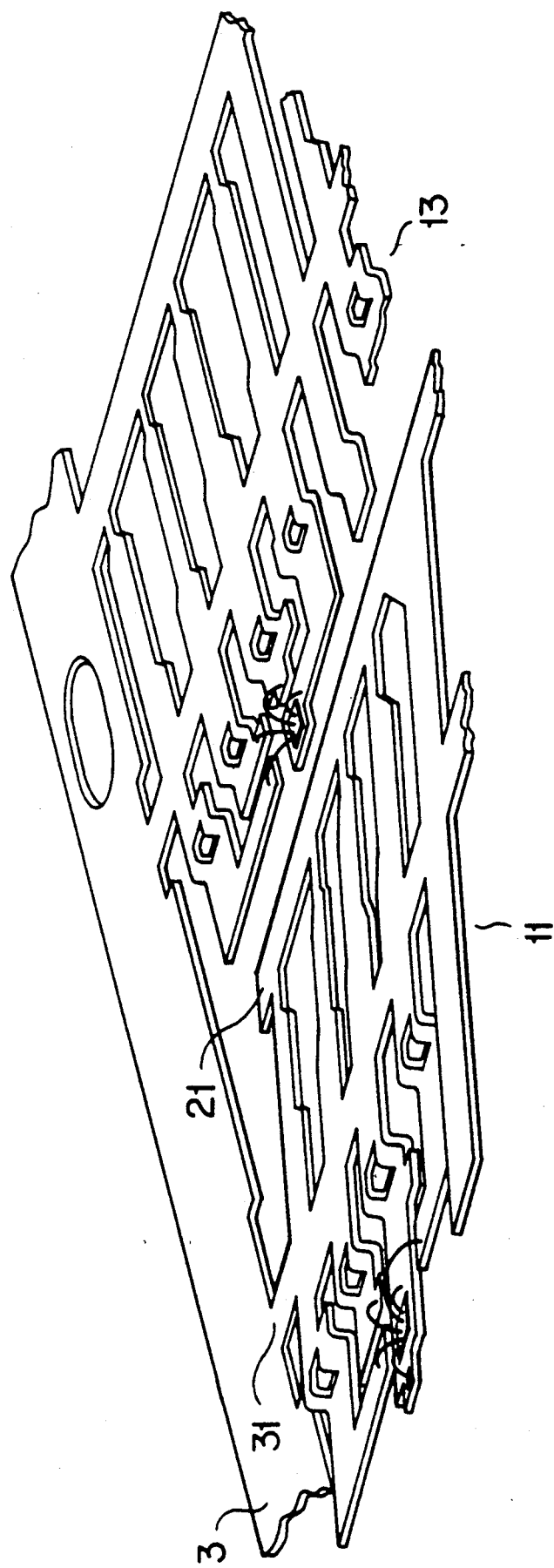
Figure 8:
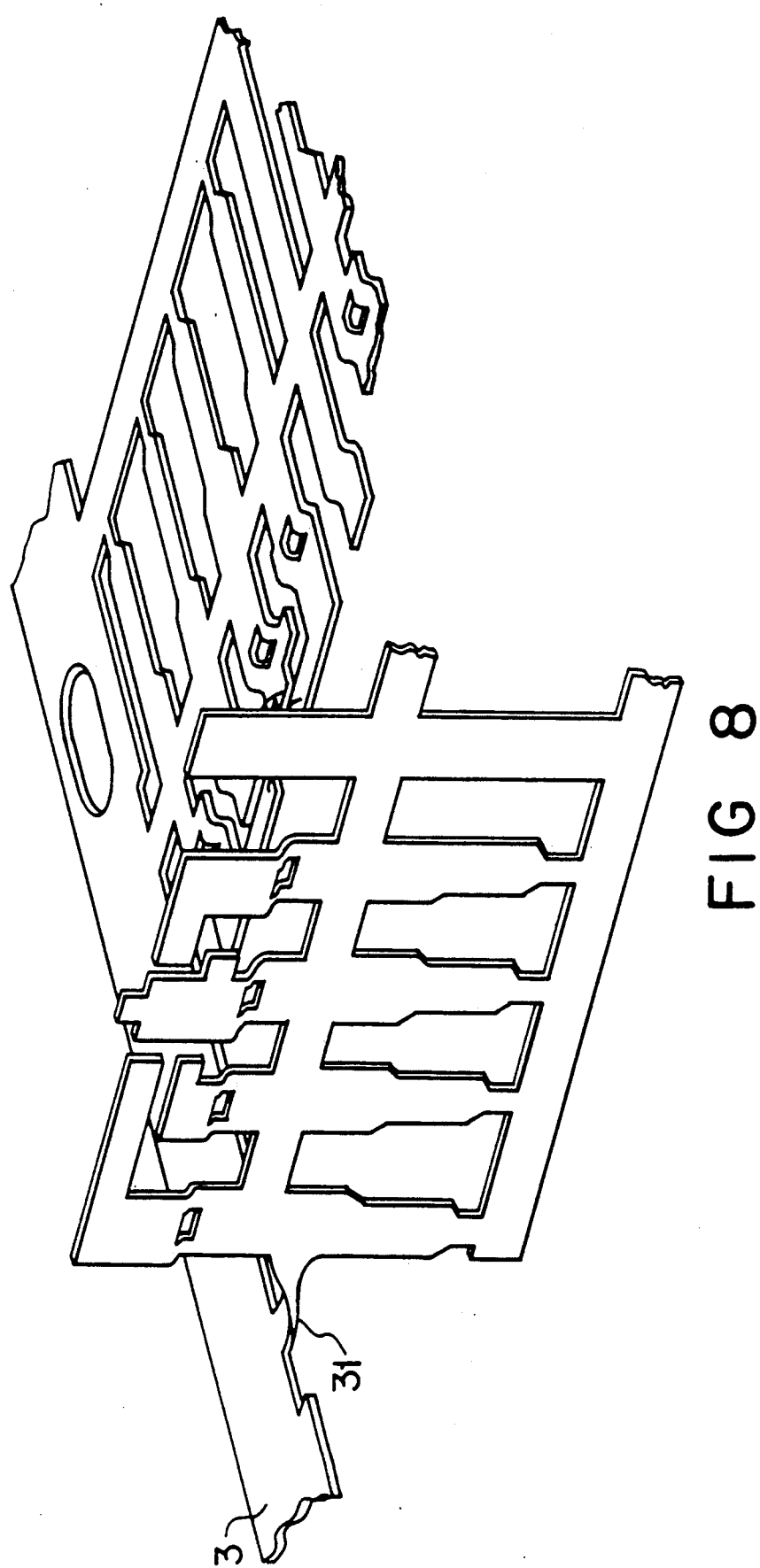
Figure 9:
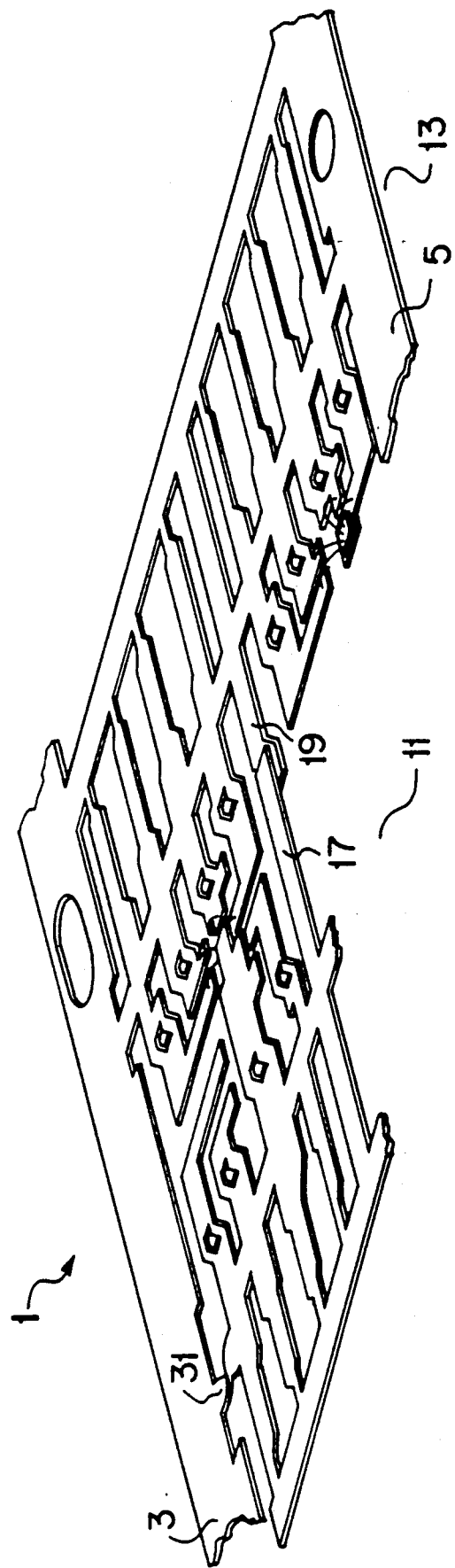

FIG. 7 shows the first of the combination steps 47 which are outlined in greater detail in the flow chart of FIG. 4B. For the sake of clarity, only the left section of the lead frame 1 is shown in FIGS. 7-9. In combination operation step 61, the tie rail 21 of LED section 11 is severed from both of the side rails 3 and 5. This leaves the LED section 11 attached only at the laterally aligned hinge pins 31, 33 and longitudinal rotation about the hinge pins is possible. The dam bar ends 35 and 37 of the photodiode section 13 are not severed and, consequently, the photodiode section 13 remains rigidly attached to the side rails 3 and 5.

In step 63, the LED section 11 is rotated approximately 15° upwards about the hinge pins 31 and 33. The rotational movements of steps 63-69 may be made in a single step or in multiple steps as required for the particular combination apparatus used. Since the lead frame 1 is configured for a standard 8-lead package, standard integrated circuit processing equipment may be used. Of course, persons of ordinary skill in the art will be well able to reconfigure the lead frame 1 to allow rotation of the photodiode section 13 instead of rotation of the LED section 11.

FIG. 8 shows step 65 in which the LED section 11 is rotated to approximately 90° relative to the plane of the side rails 3, 5. In step 67 (not shown), the LED section 11 is rotated to approximately 165°. Of course, the entire 180° rotation could be performed in a single step instead of in the multiple steps used in the preferred embodiment.

FIG. 9 shows step 69 in which pressure pads of the combination apparatus press the LED section 11 to a fully 180° rotated position coplanar with side rails 3, 5 and photodiode section 13. At this point, the arm 17 is seated against the down set area of the seat 19 and damage to the two dice may be avoided if the lead frame 1 is accidentally bumped. The arm 17 and the seat 19 may be spot welded together to provide additional stability during transfer molding. Since, unlike certain prior art devices, the size of the isolation gap is not set by compression of a dielectric sheet between the dice 91, 97 damage to the dice 91, 97 does not occur.

In order to prevent rotational spring back of the LED section 11 from the 180° rotated position the two hinge pins 31, 33 are stamped and thereby flattened The width of each of hinge pins 31, 33 must be greater than the thickness of side rails 3 and 5 so that swaging can occur. But, the hinge pins 31, 33 widths must not be so great that excessive material cold flows during stamping thereby causing buckling or deformation of portions of the lead frame 1. In the preferred embodiment, widths in the range of 0.012 to 0.016 inch were used.

Figure 10:
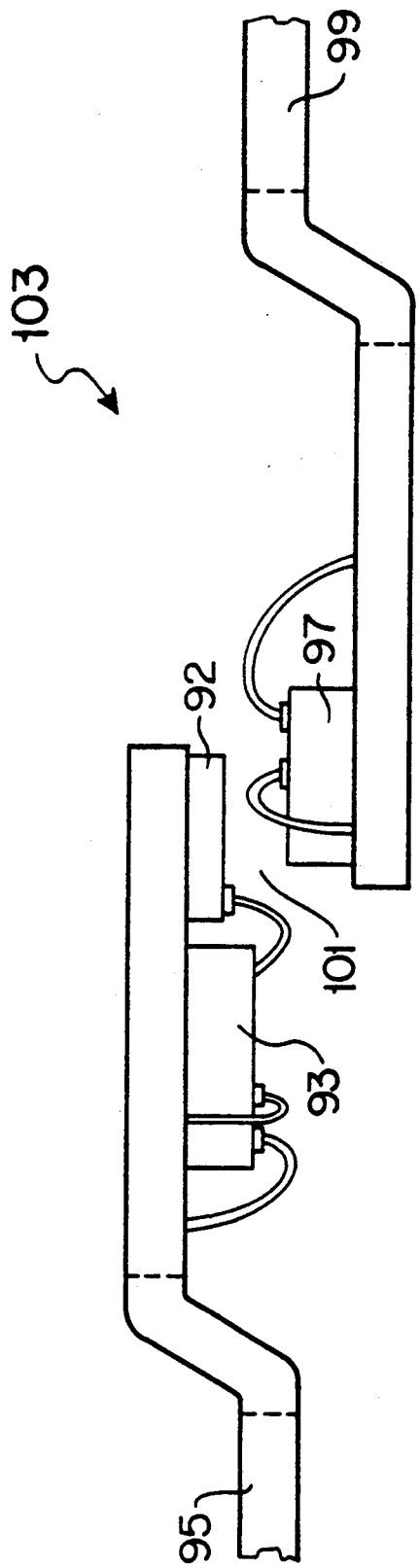

FIG. 10 shows a close-up cross sectional view of the optical isolator 103 after completion of the step 47. The LED 91 is positioned correctly over the photodiode 97 across an isolation gap 101. The size of the isolation gap 101 is determined in step 41 by the amount of down set of attachment portions 81, 83 and seat 19 and by the thicknesses of the dice 91 and 97. The leads 95 and 99 are coplanar which permits the use of standard transfer molding apparatus in step 53 and eliminates flashing on the bond leads during molding.

Figure 11:
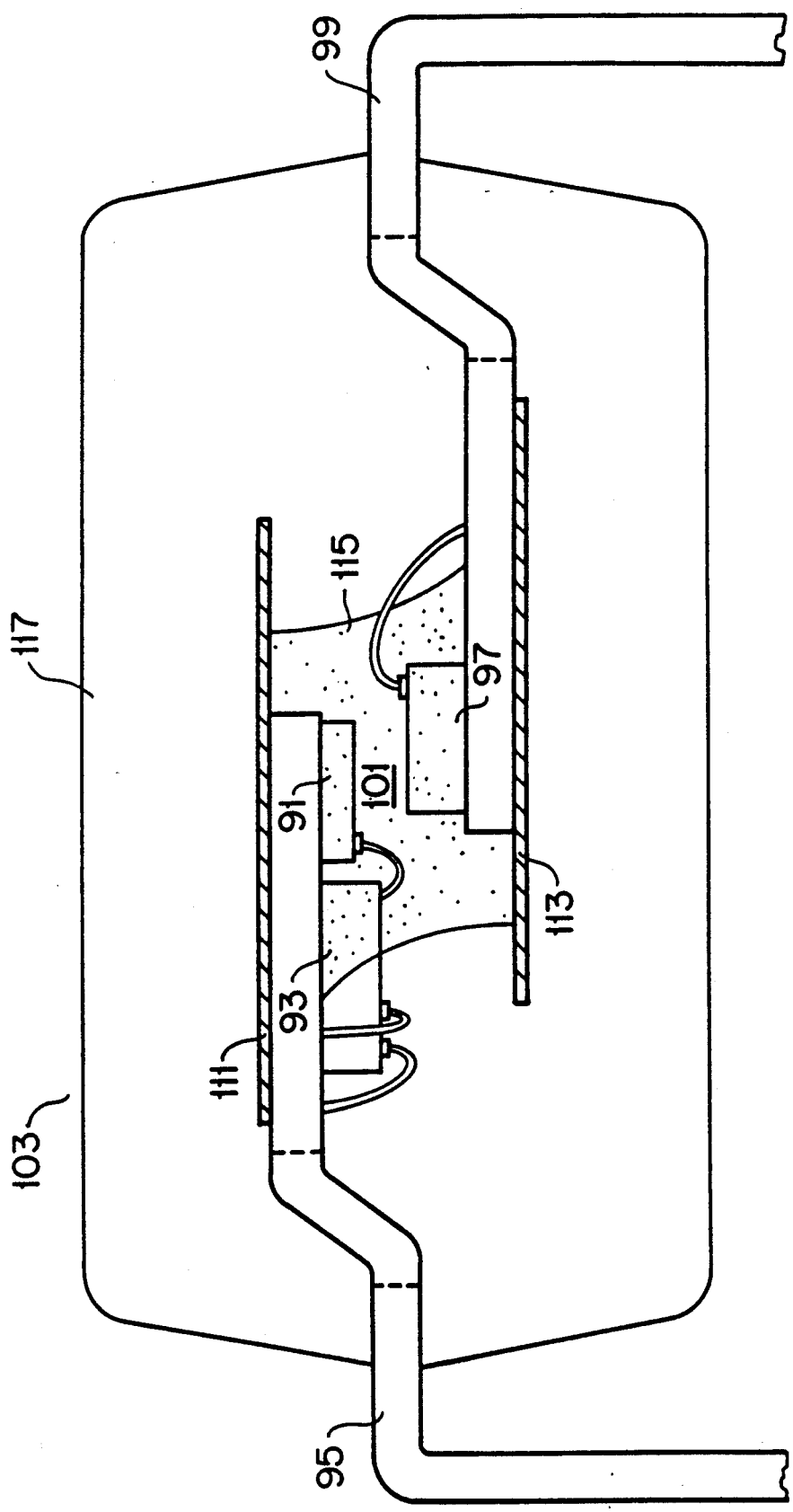

FIG. 11 shows steps 49-55 in which final packaging of the optical isolator 103 is performed. In step 49, two dielectric sheets 111, 113 are attached to the outer surfaces of leads 95 and 99. Sheets 111, 113 may be made from any nonconductive material such as 0.0028 inch thick commercially available DuPont Company Kapton tape which is cut to 0.100 by 0.100 inch in size and which has an adhesive coating on one side. In step 51, an optically transmissive silicone resin such as Dow Corning Company's Hipec Q1-4939 semiconductor protective coating is injected into the isolation gap 101 between sheets 111 and 113 to form a light guide 115. By using surface tension forces, the sheets 111, 113 limit the resin flow to the desired location and preclude structural weakening of the optical isolator 103 which could be caused by excessive resin flow. The resin effectively encapsulates the dice 91, 93, 97 within the light guide 115 and thereby reduces the risk of damage to the optical isolator 103 during thermal shock or temperature cycling.

In step 53, standard transfer molding techniques are used to encapsulate the entire optical isolator 103 in an opaque package 117 of, e.g., Nitto Electric Industrial Co. MP-101S transfer molding compound Finally, in step 55, all of the leads including leads 95 and 99 are cut from side rails 3, 5 and tie rails 21, 23 and the leads are bent to the desired packaged shape.

Figure 12:
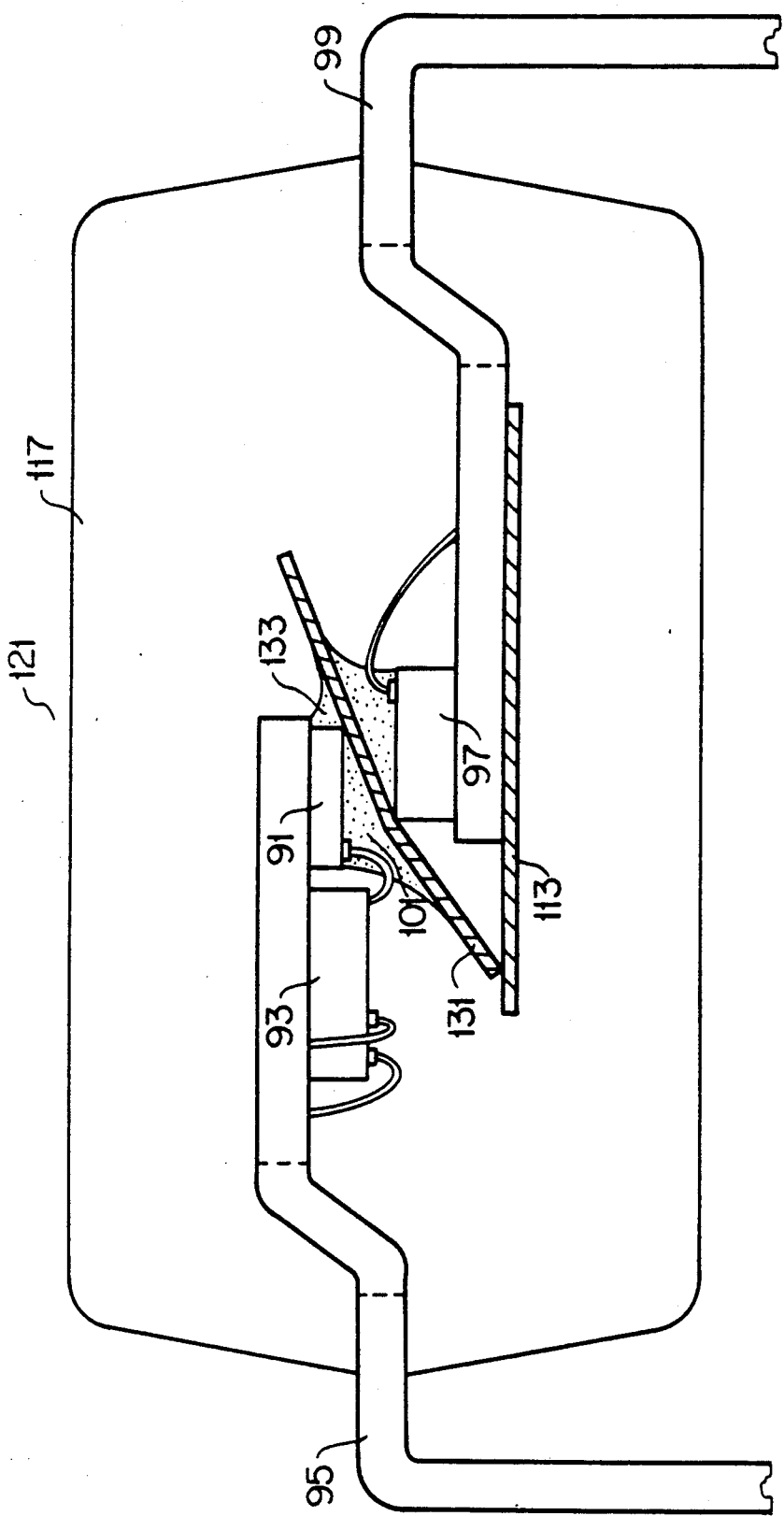
FIG. 12 shows an alternate preferred embodiment of the present invention in which a dielectric sheet is positioned between the LED and photodiode dice at a tilted angle.
Figure 13:
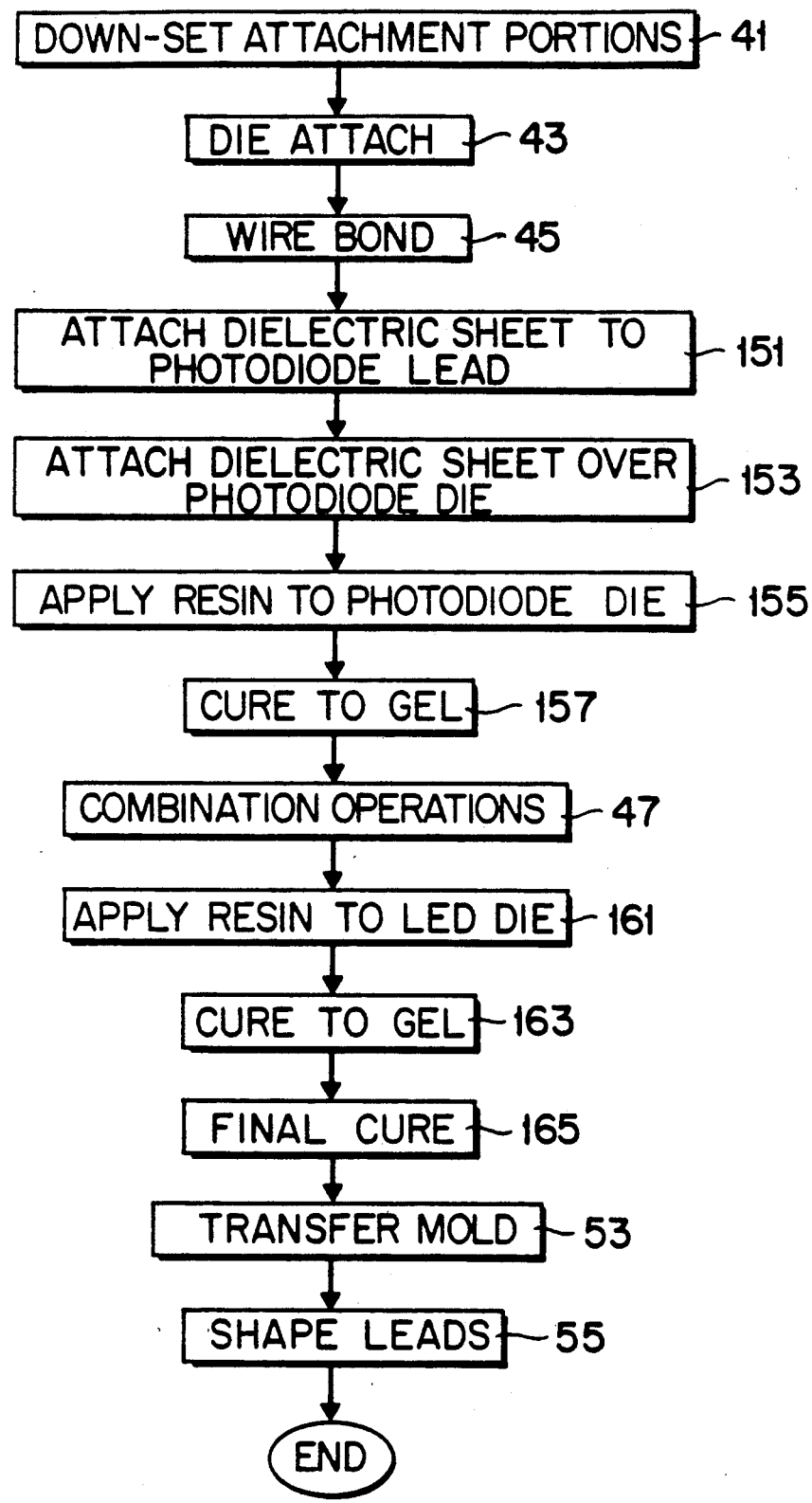
FIG. 13 is a flow chart of the assembly steps of the alternate preferred embodiment shown in FIG. 12.

FIG. 12 shows an alternate preferred embodiment of the present invention in which a dielectric sheet 131 is positioned within the isolation gap 101 between dice 91, 97. FIG. 13 is a flow chart of the assembly of the optical isolator 121 shown in FIG. 12 using a number of steps common to the flow chart of FIG. 4A. In step 151 the sheet 113 shown in FIG. 11 or any other rigid material sheet is attached to the lead 99 using the adhesive layer on the upper surface of the sheet 113. In step 153 a second dielectric sheet 131 is placed on top of the die 97 touching the end of sheet 113 and adhering to the adhesive layer thereon so that the sheet 131 is angled away from the bond wires thereby avoiding damage to the bond wires The tilted angling of sheet 131 creates a wedge shaped cavity between the sheet 131 and the die 97 in which resin 133 is contained in the desired position for transmitting light to the photodiode die 97. The sheet 131 is 0.125 inch by 0.125 inch in size and may be fabricated from a piece of DuPont Company FEP number 200C20 material.

In step 155 resin 133, discussed above with reference to FIG. 11, is applied between the sheet 131 and the die 97 and in step 157 the resin is briefly cured to attain a gel consistency Performance of the combination operations of step 47 does not result in damage to the dice 91, 97 because the size of the isolation gap 101 is determined by the amount of down set and not by compression of the sheet 131 between the dice 91, 97 as is often done in the prior art. Damage to the bond wires is avoided since the sheet 131 rests against the sheet 113 and the edge of die 97 and is thereby tilted at an angle and avoids contact with the bond wires. In step 161, additional resin 133 is applied between the sheet 131 and the die 91. The resin is cured to a gel consistency in step 163 and it is completely cured in step 165 before final steps 53, 55 are performed.

The sheet 131 has the effect of increasing the breakdown voltage of the optical isolator 121 since it has a greater breakdown voltage than does the resin 133. It also serves to increase the length of any air gap present at the interface between the resin 133 and the molding compound 117 and minimizes the effect of air bubbles within the resin 133. The angled presence of the sheet 131 creates a properly positioned and resin filled wedge shaped cavity which conducts light between the die 91, 97 and which also allows a smaller amount of resin 133 to be used so that the amount of resin that may wet the leads 95, 99 is reduced. This decrease in lead wetting results in the attainment of superior moisture penetration resistance properties by the optical isolator 121.

We claim:

1. A method for fabricating an optical isolator on a lead frame having two side rails, comprising the steps of:
   down setting an LED attachment portion of the lead frame and a photodiode attachment portion of the lead frame to a downset plane below the plane of the side rails;
   attaching a photodiode die to a photodiode lead of the downset photodiode attachment portion;
   attaching an LED die to an LED lead of the downset LED attachment portion; and
   rotating one of the attachment portions about an axis in the side rail plane which connects the side rails and thereby positioning the LED die proximate the photodiode die and separated therefrom by an isolation gap.

2. A method as in claim 1, wherein the LED attachment portion is the one of the attachment portions rotated in the rotation step.

3. A method as in claim 1, wherein the photodiode attachment portion is the one of the attachment portions rotated in the rotation step.

4. A method as in claim 1, wherein the downset plane is substantially parallel to the side rail plane and is located a predetermined downset distance therebelow and wherein twice the downset distance is substantially equal to the sum of the thickness of the isolation gap plus the thickness of the LED die plus the thickness of the photodiode die plus the thickness of the lead frame.

5. A method as in claim 4, wherein the one of the attachment portions is rotated approximately 180° during the rotation step.

6. A method as in claim 5, wherein the one of the attachment portions is attached to the side rails by hinge pins lying in the side rail plane and substantially orthogonal to the side rails.

7. A method as in claim 6, further comprising after the rotation step the step of swaging the hinge pins.

8. A method as in claim 7, wherein the hinge pins each have a width greater than the thickness of each of the side rails and no greater than 160% of the side rail thickness.

9. A method as in claim 8, further comprising after the swaging step the steps of:
   creating an encapsulating body about the optical isolator; and
   finishing the lead frame protruding from the body.

10. A method as in claim 1, further comprising after the rotation step the step of creating a light pipe within the isolation gap between the LED die and the photodiode die.

11. A method as in claim 10, wherein the step of creating a light pipe comprises the steps of:
    applying a first sheet to a backside of the LED lead opposite the isolation gap;
    applying a second sheet to a backside of the photodiode lead opposite the isolation gap; and
    filling a cavity between the first and second sheets with an optically transmissive material such that the isolation gap is filled with the material.

12. A method as in claim 11, further comprising after the filling step the steps of:
    creating an encapsulating body about the optical isolator; and
    finishing the lead frame protruding from the body.

13. A method as in claim 12, wherein: the first and second sheets each comprise a dielectric material; and the optically transmissive material comprises a resin.

14. A method as in claim 1, wherein:
    the one of the attachment portions further comprises a laterally extending arm which is coplanar with the side rails: and
    the other of the attachment portions further comprises a laterally extending seat; and
    wherein the method further comprises after the step of downsetting the step of jogging down the seat by an amount substantially equal to the thickness of the arm such that the arm rests upon the jogged down portion of the seat after completion of the rotation step.

15. A method as in claim 14, further comprising after the rotation step the step of attaching together the seat and the arm.

16. A method for fabricating an optical isolator on a lead frame having two side rails, comprising the steps of:
    down setting an LED attachment portion of the lead frame and a photodiode attachment portion of the lead frame to a downset plane below the plane of the side rails;
    attaching a photodiode die to a photodiode lead of the downset photodiode attachment portion;
    attaching an LED die to an LED lead of the downset LED attachment portion;
    attaching a first sheet to a backside of the photodiode lead such that an end of the first sheet extends beyond the end of the photodiode lead;

attaching an isolation sheet to the end of the first sheet and to an edge of the photodiode die such that the isolation sheet overlays the photodiode die at an angle;

rotating the LED attachment portion about an axis in the side rail plane which connects the side rails and thereby positioning the LED die proximate the photodiode die and separated therefrom by an isolation gap; and wherein the angled portion of the isolation sheet is positioned within the isolation gap separating the LED die and the photodiode die.

17. A method as in claim 16, wherein the downset plane is substantially parallel to the side rail plane and is located a predetermined downset distance therebelow and wherein twice the downset distance is substantially equal to the sum of the thickness of the isolation gap plus the thickness of the LED die plus the thickness of the photodiode die.

18. A method as in claim 17, wherein the LED attachment portion is rotated approximately 180° during the rotation step.

19. A method as in claim 18, wherein the LED attachment portion is attached to the side rails by hinge pins lying in the side rail plane and substantially orthogonal to the side rails.

20. A method as in claim 19, further comprising after the rotation step the step of swaging the hinge pins.

21. A method as in claim 20, wherein the hinge pins each have a width greater than the thickness of each of the side rails and no greater than 160% of the side rail thickness.

22. A method as in claim 21, further comprising after the step of attaching the isolation sheet, the step of inserting an optically transmissive material into the isolation gap between the isolation sheet and the photodiode die.

23. A method as in claim 22, further comprising after the step of swaging, the step of inserting the optically transmissive material into the isolation gap between the isolation sheet and the LED die.

24. A method as in claim 23, wherein the isolation sheet comprises a dielectric material.

25. A method as in claim 24, wherein the optically transmissive material comprises a resin.

26. A method as in claim 25, further comprising after the step of inserting the optically transmissive material between the isolation sheet and the LED die the steps of:

creating an encapsulating body about the optical isolator; and finishing the lead frame protruding from the body.

* * * * *